US008988169B2

(12) United States Patent
Hunt et al.

(10) Patent No.: US 8,988,169 B2
(45) Date of Patent: Mar. 24, 2015

(54) RADIO FREQUENCY DEVICES WITH ENHANCED GROUND STRUCTURE

(75) Inventors: Andrew Tye Hunt, Atlanta, GA (US); Zhiyong Zhao, Duluth, GA (US); Yongdong Jiang, Norcross, GA (US); Xiaoyan Wang, Duluth, GA (US); Kwang Choi, Norcross, GA (US)

(73) Assignee: nGimat Co., Atlanta, GA (US)

( * ) Notice: Subject to any disclaimer, the term of this patent is extended or adjusted under 35 U.S.C. 154(b) by 134 days.

(21) Appl. No.: 12/300,464

(22) PCT Filed: May 17, 2007

(86) PCT No.: PCT/US2007/011848
§ 371 (c)(1),
(2), (4) Date: Nov. 12, 2008

(87) PCT Pub. No.: WO2008/108783
PCT Pub. Date: Sep. 12, 2008

(65) Prior Publication Data
US 2009/0134953 A1 May 28, 2009

Related U.S. Application Data

(60) Provisional application No. 60/808,021, filed on May 24, 2006.

(51) Int. Cl.
*H03H 7/00* (2006.01)
*H01P 1/18* (2006.01)
*H01P 1/203* (2006.01)

(52) U.S. Cl.
CPC ................ *H01P 1/184* (2013.01); *H01P 1/203* (2013.01)
USPC ............................ 333/185; 333/202; 333/204

(58) Field of Classification Search
USPC ......................................... 333/185, 202, 204
See application file for complete search history.

(56) References Cited

U.S. PATENT DOCUMENTS 5,834,994 A * 11/1998 Shapiro ......................... 333/202
6,903,633 B2 * 6/2005 Zhu et al. ...................... 333/207

* cited by examiner

*Primary Examiner* — Robert Pascal
*Assistant Examiner* — Kimberly Glenn

(57) ABSTRACT

Tunable radio frequency (RF) devices, such as phase shifters and filters, are formed by depositing thin film layers on a substrate and patterning the thin film layers by various lithography techniques. A thin film metal layer is patterned to form a plurality of capacitors and inductors, leaving at least two grounding regions that lie closely adjacent the capacitors and inductors. As patterned portions of the grounding regions are electrically isolated from each other. Performance of the devices are improved by electrically bridging the differential potential grounding regions.

16 Claims, 9 Drawing Sheets

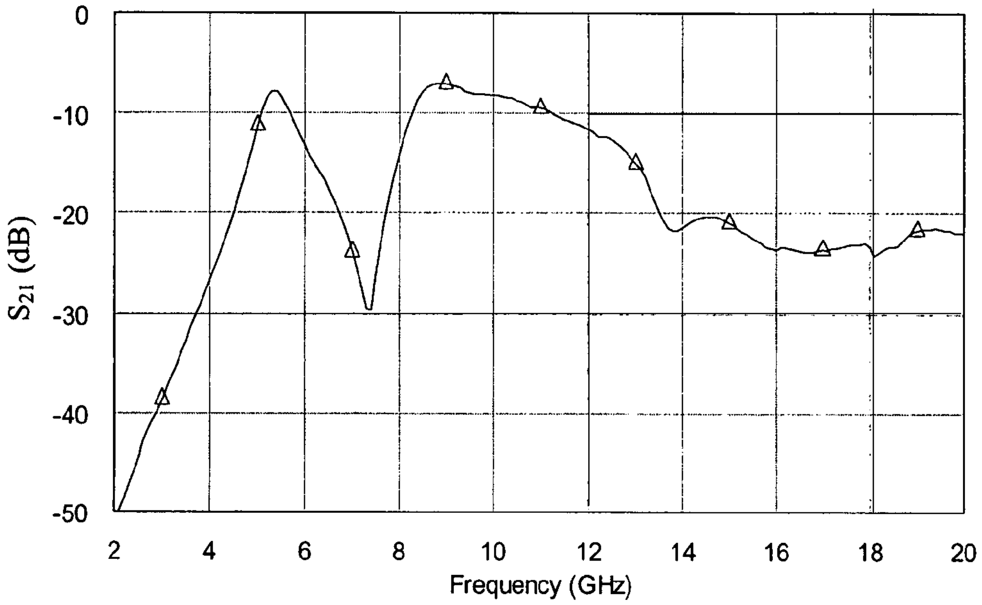
(8a)
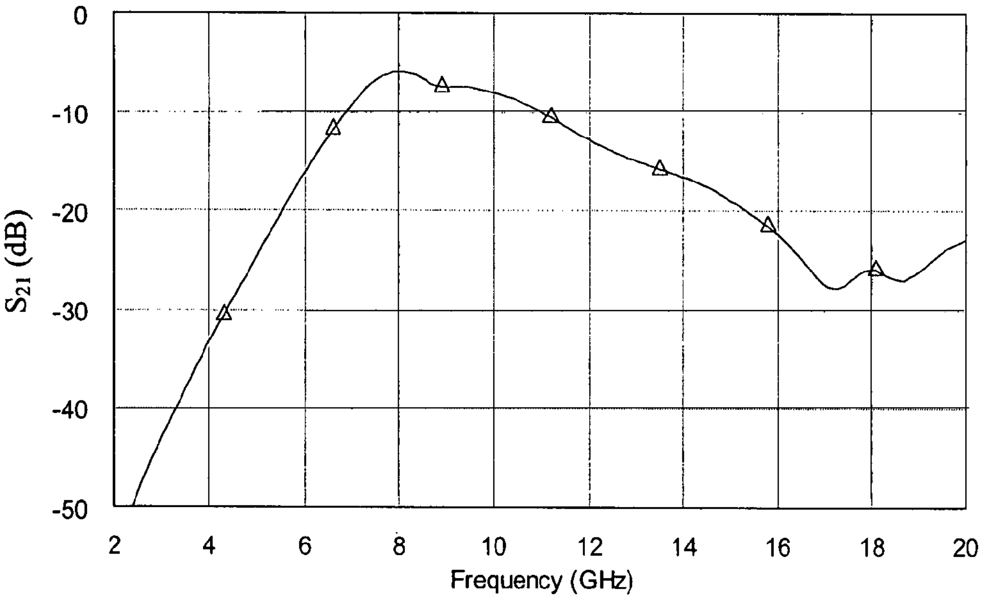
(8b)
Figures 8a above and 8b lower plot

(11a)

(11b)

RADIO FREQUENCY DEVICES WITH ENHANCED GROUND STRUCTURE

CROSS REFERENCE TO RELATED APPLICATIONS

This application is a national phase filing under 35 USC §371 of international application no. PCT/US2007/011848, filed May 17, 2007, which claims priority from U.S. Provisional Application Ser. No. 60/808,021, filed May 24, 2006. The entirety of each of these applications is incorporated herein by reference.

The present invention is directed to radio frequency (RF) devices based on combinations of inductors and capacitors that are formed from multiple thin film layers, particularly tunable filters and phase shifters, having ground bridges and coplanar waveguide structures that enhance performance of such devices. The way that the capacitors or inductors are varied can be any means.

BACKGROUND OF THE INVENTION

As frequency of operation is increased the structure carrying electronic signals changes. At microwave frequencies it is common to have combined ground and signal structures to minimize loss and maintain signal integrity. To modify signals it is common to use inductor and capacitor effects to enable such changes as filtering and delaying. It is desired in many cases to be able to tune or modify the intensity of the effect, and one way of accomplishing this is to vary the value of the capacitor.

Variable dielectric materials exhibit re-orientable spontaneous polarization, resulting in a variable dielectric constant. The dielectric constant can be varied when an electric field is applied, a key property rendering it appealing for applications in tunable microwave devices. Tunable dielectrics include ferroelectrics such as Barium Strontium Titanate ($Ba_xSr_{1-x}TiO_3$, where x is between 0 and 1, preferably between 0.1 and 0.9, and more preferably between 0.4 and 0.6, or BST) and other materials such as Bismuth Zinc Niobate (BZN). Studies of variable dielectric microwave devices started in the early 1960s, however it is only recently that the interest is rejuvenated, thanks to the maturity of process in making low-loss, high-tunability ferroelectric materials. BST is among the most studied ferroelectric materials due to its high dielectric constant, high breakdown voltage, and relative low loss. Examples of microwave applications include, but are not limited to, varactors, tunable filters, phase shifters, oscillators, tunable matching networks, resonators, and delay lines.

Variable dielectric materials can be made in the form of bulk, thin films and thick films. Ferroelectric films show moderate temperature-dependent dielectric constant variation (temperature coefficient). Modifications in film deposition have resulted in improved dielectric constant-temperature responses, such as the use of multilayered films, each layer having different Curie temperatures. Optimization in circuit design can also alleviate the temperature dependence of dielectric constant. BZN has an even lower temperature coefficient and lower loss, but the dielectric constant is also lower.

Both distributed and lumped-element microwave devices have been designed employing ferroelectric materials. Ferroelectric materials, such as BST, exhibit high dielectric constant (e.g., 500 for BST thin films and 10,000 for bulk BST), having advantages of reducing device sizes. However, this makes impedance matching difficult in a distributed circuit such as a coplanar waveguide (CPW). Lumped element circuits, on the other hand, utilize fewer components, further reducing part size and loss.

This invention is directed to improved lumped-element RF components such as tunable filters and phase shifters. In particular, the invention involves blending a CPW nature in with lumped element circuits. The ground structure becomes very important when blending CPW in components with at least three inductors, more importantly, when four or more inductors are included in the structure, and is even more particularly important when there are cascaded lowpass/highpass filters and cascaded phase shifters. The operating frequency of these devices is generally in the range of 2-35 GHz, but broadly is in the range of 0.5-50 GHz, or greater.

The core of lumped-element tunable dielectric devices is a tunable capacitor, in which a tunable dielectric material, more commonly when BST is the variable dielectric. Variable dielectric capacitors can be fabricated using parallel plate or planar configurations. Parallel plate thin film structures use low DC voltages for tuning (e.g., <20 V), but the fabrications are sophisticated due to the patterning and etching of the Pt bottom electrode normally used with BST. Furthermore, the growth of a highly crystalline and defect-free BST thin films requires a chemically compatible bottom electrode that is electrically conductive at microwave frequencies. Platinum has been the primary bottom electrode for the parallel-plate BST capacitors, but its poor conductivity leads to high device losses. On the other hand, planar configurations require fewer lithography steps and allow for thicker metal to be deposited for lower metal losses. Most importantly, epitaxial films can be deposited onto single crystal substrates ensuring lower dielectric losses and higher dielectric constants. Deposition techniques, such as pulsed laser deposition (PLD) and metalorganic chemical vapor deposition (MOCVD), have been employed to grow epitaxial films on expensive substrates such as MgO and $LaAlO_3$. These processes, however, are expensive, require costly starting materials, and have low throughput. Sputtered films often require post-deposition annealing to improve crystalline quality.

The recently developed open atmosphere, low cost combustion chemical vapor deposition (CCVD) technology offers an attractive alternative to grow epitaxial BST thin films on inexpensive sapphire substrates with good yield and high throughput potential. CCVD deposition of BST thin films is described, for example, in U.S. Pat. No. 6,986,955. Another tunable dielectric material useful as the dielectric for tunable capacitors is bismuth zinc niobate (BZN). Bismuth zinc niobate belongs to a category of oxide pyrochlore with a general formula of $A_2B_2O_6O'$ (O'=seventh oxygen), which is not ferroelectric. BZN exhibits moderate permittivity (170-200), very low loss (tan $\delta \sim 5\times10^{-4}$) and large tunability (55%) at low frequencies (~1 MHz). Furthermore, its temperature coefficient of capacitance can be adjusted between −400 and 200 ppm/° C. through composition variations and process control.

With the pervasive growth of electronic systems in the military, commercial, and public safety marketplaces, there is a growing need for low cost devices with reduced size, weight, and power (SWAP), yet added functionality and superior performance. Making spiral inductors greatly reduces size of lumped elements components, but symmetry is reduced with spiral versus straight inductors. The ground structures or the present invention allow the proper performances with non-symmetrical designs even when a CPW theme is used for the structure of the main signal.

One important application of the invention is formation of tunable filters. Microwave filters are widely used in radar, communications, test equipment, and electronic warfare (EW) systems. In the case of high frequency receivers, filters must be used to remove signals in unwanted frequency bands to prevent overload of the receiver itself and to prevent undesirable interference from signals outside the band of operation. On the transmit side, signal purity must be maintained in order to minimize interference to other users, to conform with government regulations for radio emissions, and, in the case of military applications, to minimize detection of the radio source by hostile forces.

Tunable filters are used in all major areas of microwave engineering. Most tunable filters described in the literature fall into three basic types: mechanically tunable, magnetically tunable, and electronically tunable filters. Compared to mechanically and magnetically tunable filters, electronically tunable filters can be tuned very fast over a wide (an octave) tuning range, and they offer compact size. Most of the electronically tunable filters use varactor diodes and at higher frequencies these are based on GaAs. The varactor diode capacitance varies with reverse voltage; when a varactor is in series with a resonator circuit or element, this capacitance change alters the resonant frequency. However, these varactor-tuned filters have low power handling capability and consume power for operation.

In recent years, tunable dielectric and radio frequency microelectromechanical systems (RF MEMS) technologies have emerged as a promising candidate for tunable microwave device applications. They both show high power handling capability, negligible power consumption, and high isolation.

Ferroelectric BST-based tunable filters have been demonstrated by a number of groups. RF MEMS switch based tunable filters have shown much lower loss, but they tend to exhibit discrete and slow tuning, and can have reliability problems.

For modern multiband and multifrequency communication systems, reconfigurability in frequency and bandwidth is desired. The most widely used tunable techniques involve variable resistance elements to produce continuous tuning and coupling variation by means of varactor diodes. Switchable bandwidth has been realized by means of pin diodes and inter-digital coupled resonators. Herein is described cascading of a tunable lowpass filter (LPF) and a tunable highpass filter (HPF) to achieve a bandpass filter (BPF) or a bandstop filter (BSF). By tuning the LPF and HPF separately, not only is the center frequency of the BPF (or BSF) tuned, but also its bandwidth is varied when either LPF or HPF is tuned.

LPF is a filter that passes lower frequencies, and rejects higher frequencies. A series inductor or shunt capacitor or combination of the two is a simple low-pass filter. An HPF passes higher frequencies and rejects lower ones. A series capacitor or shunt inductor or combination of the two is a simple high-pass filter. Several popular filter functions are Chebyshev (equal-ripple amplitude), Bessel-Thomson (maximally flat group delay), Butterworth (maximally flat amplitude), and Gaussian.

Another important application of the invention is phase shifters formed of multiple thin films. Phase shifters are an essential component in electronically scanned phased-array antennas for communication and radar applications, and typically represent a significant amount of the cost, size and weight of producing military tactical antenna array. Jamming and interferers of mobile communication devices can be eliminated via phase shifters while still receiving the desired signal even with the interferer being at the same frequency.

Compared to mechanically and magnetically tuned phase shifters, electronically tunable phase shifters are compact, have fast response, and consume less power. Semiconductor-based phase shifters use pin diodes, GaAs varactors, or metal-oxide-semiconductor field-effect transistors (MOSFET) as the switching or tuning element. Even though these devices are inexpensive, they have higher loss at K-band or higher frequency bands and low power handling. Microelectromechanical switches (MEMS) use advanced integrated circuit (IC) processing techniques, which offer potential integration with GaAs monolithic microwave integrated circuits (MMIC) or MOSFET technologies. They provide low insertion loss, high isolation, negligible power consumption, and low intermodulation distortion (IMD); however, they require high driving voltage (e.g. 40 V or higher), have low switching speed (>10 μs), and can suffer from discontinuity, reliability, packaging, and variable g-force problems. The present invention applies to all variable capacitor based structures that can be varied by any afore mentioned methods for making tunable capacitors or inductors, but tunable dielectrics are the preferred embodiment.

Tunable dielectric materials exhibit inherently tunable capacitance through only a single DC bias voltage, and these tunable dielectric devices have continuity (analog), fast tuning speed, low loss, durability, low power consumption and high power handling. All these unique characteristics have attracted attention for microwave applications such as tunable filters, phase shifters, matching networks, and oscillators. Nevertheless, the progress made on tunable dielectric devices has been elusive. The problem is multi-faceted: (i) the loss was still high compared to its counterparts, attributed to the poor crystalline quality, (ii) a process of making high-quality, large-area BST at reasonable cost did not exist, and/or (iii) the required DC bias voltage was too high (~100 V) or IMD was an issue.

Epitaxial BST films on commercially practical sapphire wafers, described in above-referenced U.S. Pat. No. 6,986,955, has demonstrated low loss and high tunability. Low-voltage (<20 V) capacitor structures that displayed improved IMD performance are described in U.S. Pat. Nos. 6,986,955, 6,970,500, and 7,031,136.

Several design options for variable capacitor phase shifters have been proposed. Reflection-type phase shifters consist of a 3-dB coupler and reflective loads. While wide bandwidths may be achieved with the reflection type topology, the coupler contributes directly to the insertion loss of the phase shifter, and requires a large portion of the die area. Loaded-line phase shifters are controlled by varying the capacitive loading on a coplanar waveguide transmission line. The phase shifters using this topology tends to become long at low frequencies (<10 GHz). Phase shifters have been designed using an all-pass network (APN) topology, which exhibit small size and low loss.

SUMMARY OF THE INVENTION

RF variable devices, particularly tunable filters and phase shifters, are formed from multiple thin film layers, one of which is a thin film of conductive material, typically a thin film metal layer (<10 microns thick). The thin film conductive material layer is patterned, e.g., by photolithographic techniques, to remove portions of this layer so as to form conductive traces, including the conductive portions of inductors and capacitor electrodes, and so as to leave substantial RF-grounding portions of the conductive material layer. The RF ground is electrically separated from the RF signal by inductors or capacitors. The ground structures are oddly shaped when multiple inductors and capacitors are formed together in one device, and the ground can loose its correct potential due to its shape and interaction/coupling with the lumped elements and signal lines. This occurrence is greatest where the ground is narrow in form, comes to a sharp end, and is closely adjacent to the signal conductive traces. To address this and maintain small part size with low loss, extended ground structures need to be connected via conductive, e.g., metal, connections that pass over the elements or signal lines joining nearby grounds to minimize ground potential drift. This is particularly important in the areas near the capacitor electrodes and conductive portions of the inductors that are nearest to connection with the primary signal. In accordance with the invention, the performance of such RF devices is improved by providing electrically conductive structures that bridge RF electrically disconnected portions of the RF-grounding portions of the conductive layer.

Of particular importance is small size and high performance. CPW lines, where the ground and signal lines have certain separations based on the materials used and frequency of operation, are commonly used to minimize loss and thus are desired at the RF interfaces with the designed device. By continuing the relation of the grounds to the signal as if it were a CPW device as much as possible through the design, the performance of the lumped element device is optimized. This is a type of unique blend between CPW and lumped elements. When the capacitors and inductors are designed to be symmetrical or there are two or fewer inductors the device can perform well without ground bridges, but as the complexity and asymmetry increases so does the need for ground bridges to ensure stable ground potential. Thus when there are three or more or preferably four or more inductors the need is even higher, and as there are five or more inductors there is further need of ground bridges. The most important need for ground bridges is when two or more components are cascaded into a single device.

BRIEF DESCRIPTION OF THE DRAWINGS

FIG. 8*a* is a measured result of a BPF as per FIG. 7*b* without ground bridges in accordance with the invention and FIG. 8*b* is a measured result of a BPF as per FIG. 7*b* with ground bridges in accordance with the present invention.

DETAILED DESCRIPTION OF CERTAIN PREFERRED EMBODIMENTS

Figure 1:
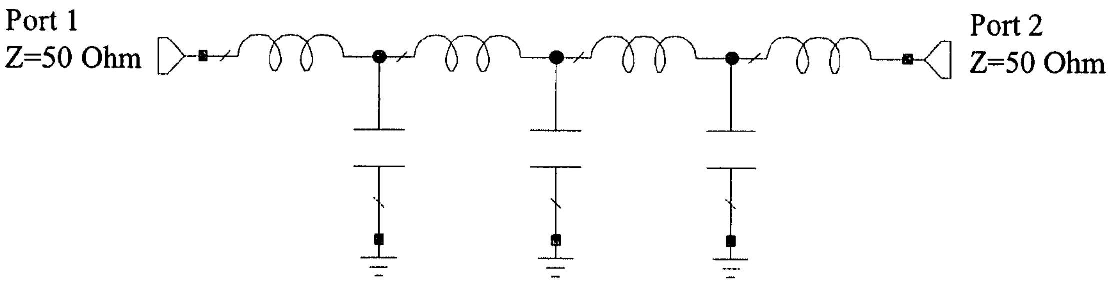
FIG. 1 shows a schematic of a $7^{th}$-order lumped-element Chebyshev lowpass filter; it has four series inductors and three shunt capacitors.
Figure 2:
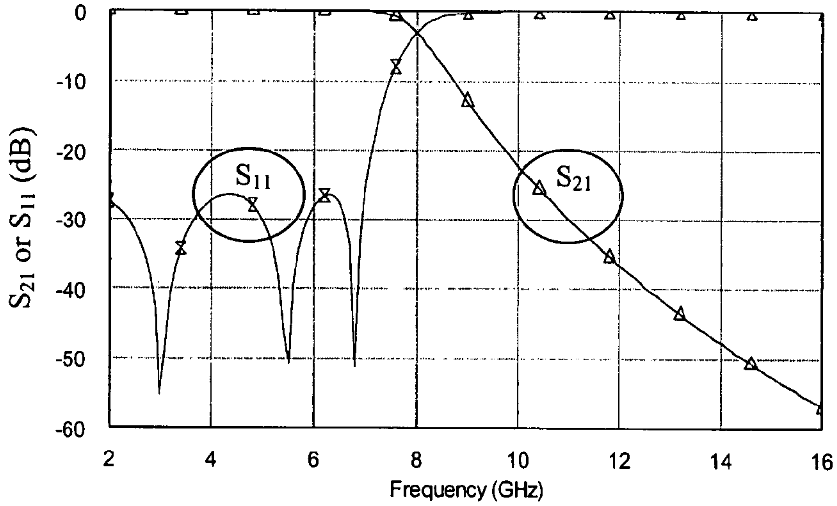
FIG. 2 shows the ideal electrical responses of the filter of FIG. 1 with a cutoff frequency of 8 GHz and a passband ripple of 0.01. In this and other figures, $S_{11}$ is return loss (or reflection) and $S_{21}$ is insertion loss (or transmission coefficient).
Figure 3:
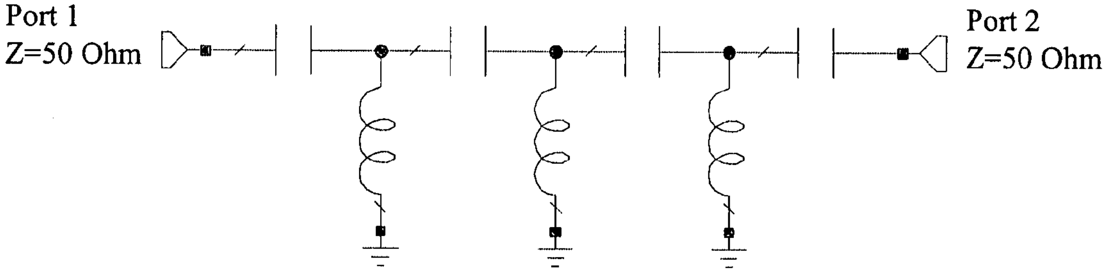
FIG. 3 shows a schematic of a $7^{th}$-order lumped-element Chebyshev highpass filter; it has four series capacitors and three shunt inductors.
Figure 4:
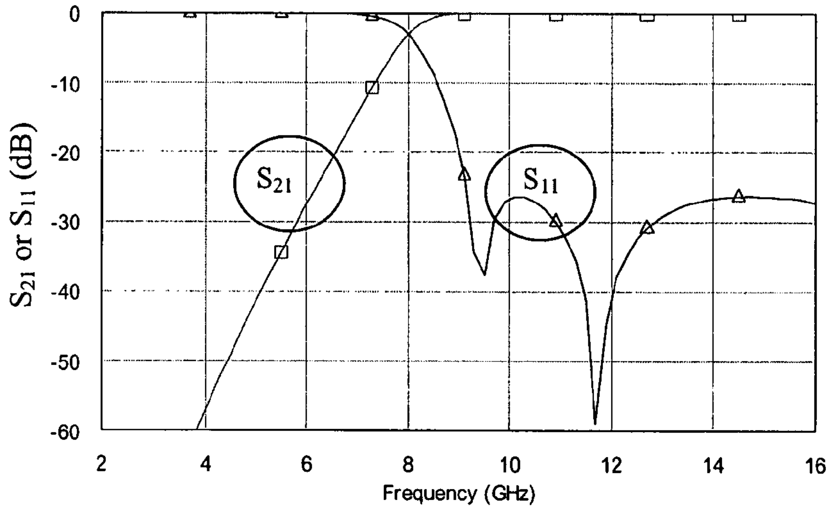
FIG. 4 shows the ideal electrical responses of the filter of FIG. 3 with a cutoff frequency of 8 GHz and a passband ripple of 0.01. When BST tunable capacitors are used in these circuits, the cutoff frequencies can be varied as the BST capacitors are tuned through application of DC biases.
Figure 5:
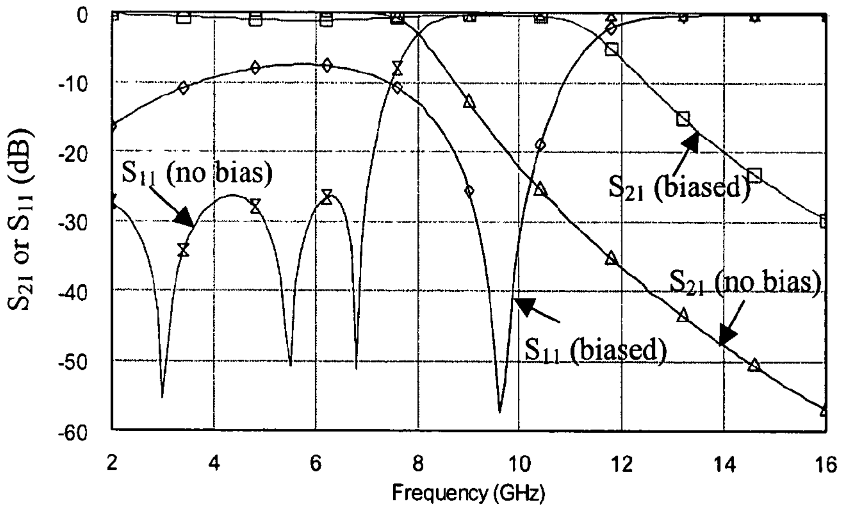
FIG. 5 shows the responses (ideal) of the $7^{th}$-order HPF of FIG. 3 with tunable BST capacitors, whose values are down by 2.5:1 when tuned.

FIG. 1 shows a schematic of a $7^{th}$-order lumped-element Chebyshev lowpass filter. It has four series inductors and three shunt capacitors. FIG. 2 shows the responses of this filter with a cutoff frequency of 8 GHz and a passband ripple of 0.01. FIG. 3 shows a schematic of a $7^{th}$-order lumped-element Chebyshev highpass filter. It has four series capacitors and three shunt inductors. FIG. 4 shows the responses of this filter with a cutoff frequency of 8 GHz and a passband ripple of 0.01. When tunable capacitors are used in these circuits, the cutoff frequencies can be varied as the capacitors are tuned through application of DC biases. FIG. 5 shows the responses of the $7^{th}$-order LPF with tunable capacitors, whose values are down by 2.5:1 when tuned. The principle of tuning also applies to HPF, bandpass filters (BPF), and bandstop filters (BSF).

Figure 6:
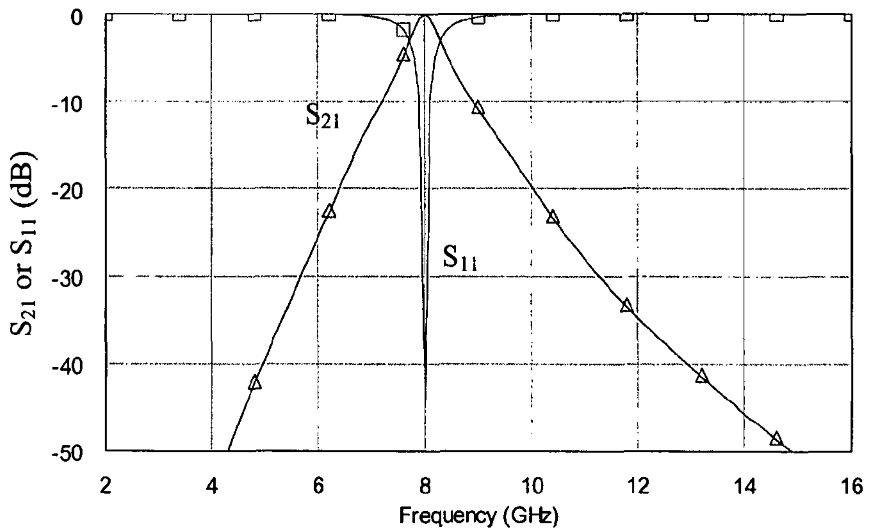
FIG. 6 shows the ideal responses of a bandpass filter (BPF) formed by cascading the LPF of FIG. 1 and the HPF of FIG. 3. Note that the cutoff frequencies of the LPF and HPF have been redesigned so that a BPF with good responses can form.

When the two filters shown in FIG. 1 and FIG. 2 are cascaded, the entire device behaves like a BPF. The simulated responses are shown in FIG. 6. So when both the LPF and HPF are tuned at the same rate, the center frequency of the BPF moves. While only the capacitors in the LPF or HPF are biased, the bandwidth varies.

Based on the above principle, a thin film lumped element circuit has been constructed. A short piece coplanar waveguide (CPW) is used at both input and output. The CPW facilitates measurements using ground-signal-ground (GSG) probes, and the attachment of the filter onto a printed circuit board (PCB) using a flip chip technique or wire bonding. Schematic of a LPF and cascaded LPF/HPF with such inputs and output is shown in FIG. 7.

Figures 7A, 7B:
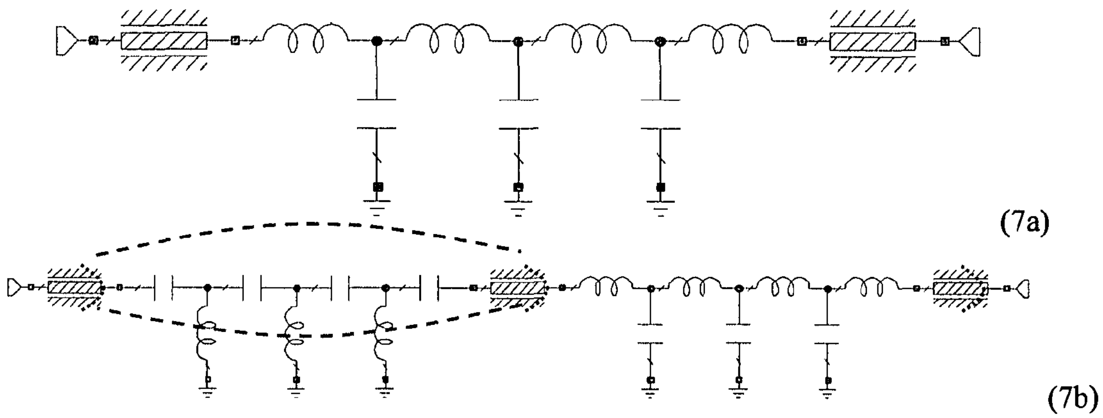
FIG. 7*a* is a schematic of a $7^{th}$-order lowpass filter and FIG. 7*b* is a schematic of a BPF, each with CPW input and output.

This invention relates to a ground structure that enables proper or enhanced operation of the filter, as highlighted in FIG. 7. For the capacitors both planar and parallel-plate configurations can be used, while spiral or straight inductors are both suitable. The ground connections can be realized by wire bonds, but preferably by metal bridges. FIGS. 8*a* and 8*b* show the measured results of a BPF before (8*b*) and after (8*a*) adding wire bond ground bridges. Note that a $5^{th}$-order LPF and a $7^{th}$-order HPF were used, so the roll-off on the high frequency side is not as steep. It can be seen that while without ground bridges (FIG. 8*a*) two peaks are observed, and with ground bridges (FIG. 8*b*) the desired single peak is observed. For this fabricated part BST was used and the frequency and bandwidth could be adjusted.

Figure 9:
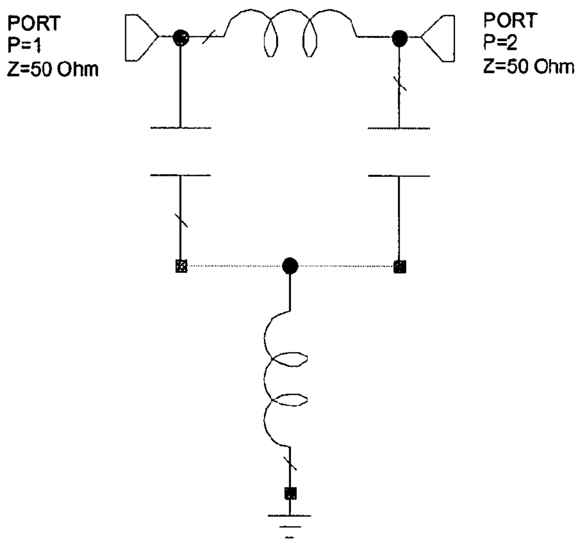
FIG. 9 shows the schematic of an all-pass network (APN) phase shifter. BST capacitors are used to shift the phase.

FIG. 9 shows the schematic of an all-pass network phase shifter. Tunable capacitors are used to shift the phase.

Figure 10:
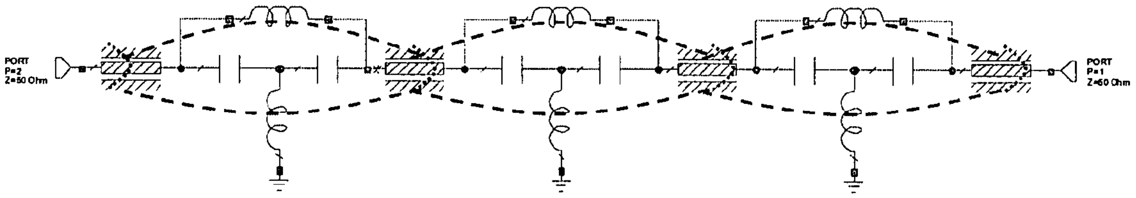
FIG. 10 is a schematic of three cascaded APN phase shifters with ground bridges and CPW I/Os.

Simulations show that for a 2.5:1 capacitor tunability, 120 degrees of phase shift can be achieved, so for 360 degrees of phase shift, three of such phase shifters are required. In this invention, a short piece of CPW is attached to the inputs and outputs of each phase shifter, and ground bridges are required to enable a functional phase shifter. A schematic of such a device is schematically shown in FIG. 10.

Figure 11A:
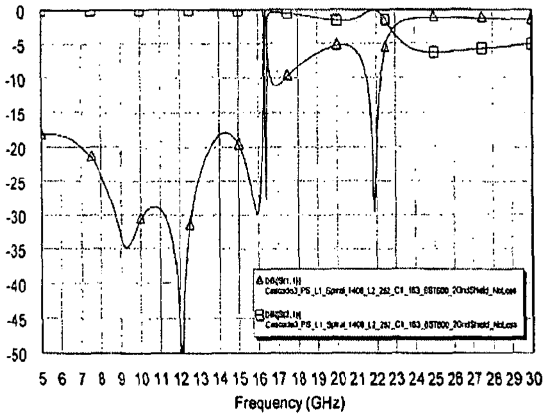
FIG. 11 shows simulated results of three cascaded APN phase shifters (a) without and (b) with ground bridges.
Figure 11B:
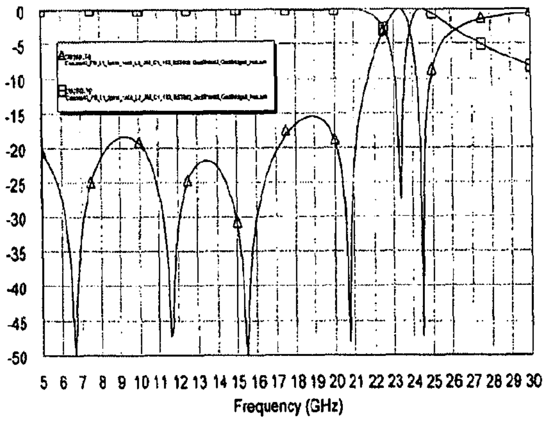

FIG. 11 shows the simulated results of three cascaded APN phase shifters with and without ground bridges.

Figure 12:
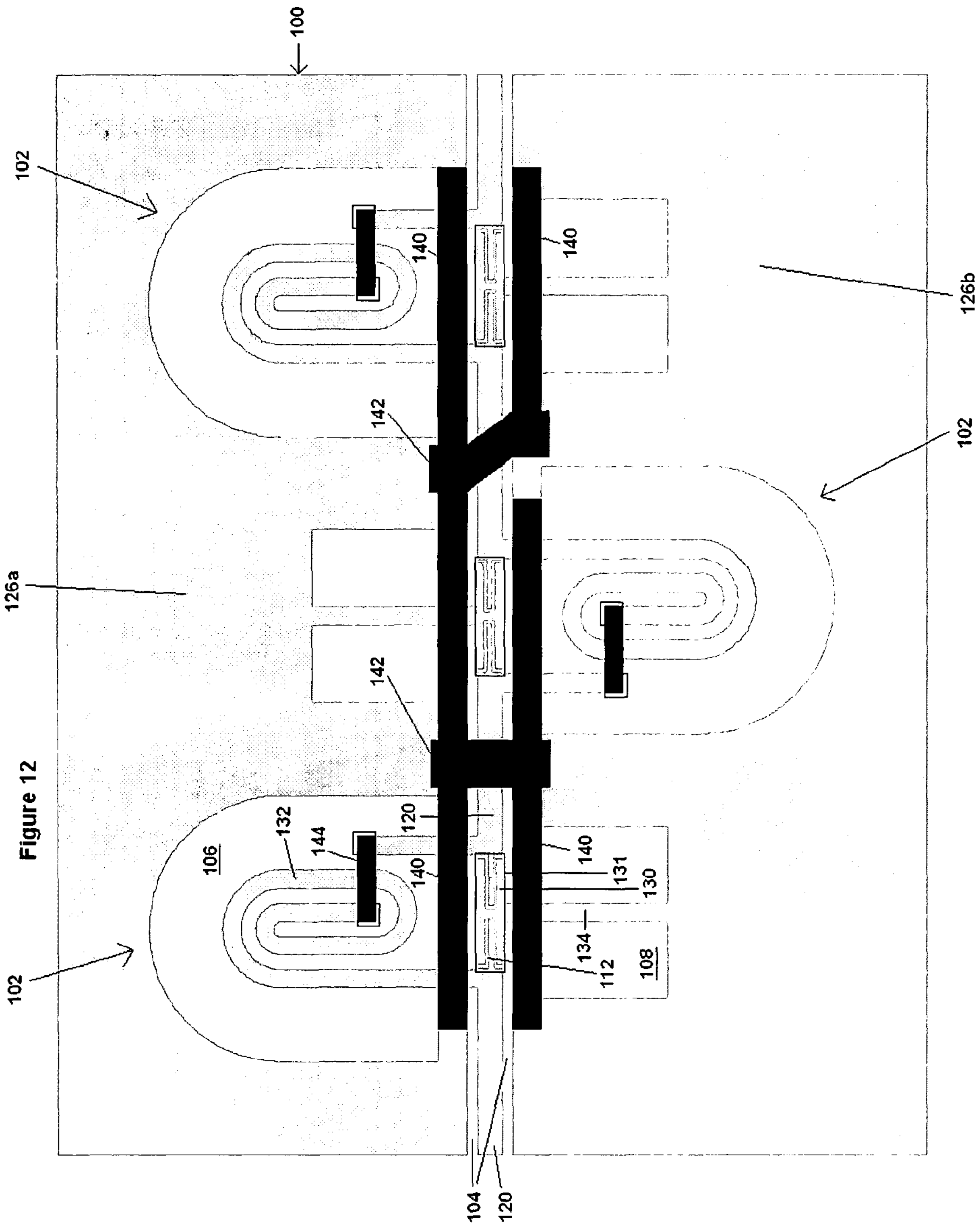
FIG. 12 is a top plan view of a phase shifter having ground bridges and a lumped element/CPW blend in accordance with the present invention.

FIG. 12 is a phase shifter device 100, including three cascaded phase shifters 102 patterned from multiple thin film layers by lithogrophy, deposition and lift-off. What was originally a continuous metal thin film layer covering patterned photoresist is a structure that, upon removal of metal, i.e., by lift-off, from regions 104, 106, 108, and 112 comprises central RF transmitting structures indicated generally at 120 and grounding regions 126*a* and 126*b* lying along and closely adjacent to the transmitting regions 120. The grounding regions 126*a* and 126*b* are electrically separated from each other by the metal-removed regions 104, 106, 108, and 112. The remaining portions of the metal layer and metal-removed regions define RF structures including capacitors 130, in which dielectric material 131 underlies the regions of the capacitors, the spiral inductors 132, and the straight inductors 134. In accordance with the invention, grounding regions 126*a* and 126*b* are electrically connected by bridge structures 142 and various remote portions of grounding regions 126*a* and 126*b* are internally bridged by structures 140. Bridge structures 144 also are shown bridging portions of the spiral inductors 132. All of the bridge structures 140, 142 and 144 are formed together in the lithography/deposition/lift-off processes used to print this structure. A coplanar waveguide (CPW is formed by using the correct width of structures 120 and 104 relative to the grounds and the dielectric constant of the substrate (sapphire in this example).

In phase shifters the ground bridges improve performance by the same method in all the inductors and capacitor devices. Without the bridges, the ground loses its uniform potential by being shaped around multiple elements (element being an inductor, capacitor or transition from a CPW section). Each element is designed to have certain properties, and these properties change if the metal nearest it has a different potential. The ground bridge structures of the present invention cause the ground potential to be more uniform, thus the individual elements react more as designed with no localized resonances.

The ground bridges do have some interaction with the elements they pass near by; they basically form a small value capacitor to the ground. To minimize this effect a low dielectric material should be used when making the ground bridges, and the bridge width should not be any wider than is required to make the ground potential sufficiently uniform. Too narrow a ground bridge takes on the properties of an inductor, which will not achieve the desired neutralizing effect. Generally the ground bridges should be at least as wide as the metal lines used to form the inductor elements, and more preferably at least 2 times as wide.

Whenever possible the ground metal on either side of the signal line should be evenly balanced and not have CPW that ends or starts on either side non-uniformly. An important area to analyze for need of a ground bridge is where the CPW ends near an element. Ground bridges may be needed either across the signal line or parallel to the signal line or a combination of both crossing and parallel ground bridges may be needed. At the joining of devices, as when individual phase shifters or filters are cascaded together, or at the ends of non-symmetrical elements, ground bridges over the signal line may be needed. Structures with and without ground bridges can be simulated to determine where ground bridges may be desired. Simulations have demonstrated that in many cases ground bridges either improve performance or are required to make devices function as intended. For efficiency, devices may be designed having ground bridges where their need is anticipated, and simulations can be run on these designs. If the simulations show good results, the need to simulate comparable structures without ground structures may not be necessary.

Minimizing the length of the total structure is desired to decrease device size and cost, minimize potential resonances, and reduce metal loss. Making interdigitated capacitors (IDC) or parallel plate capacitors (PPC) and spiral inductors, instead of straight-line-based elements, can reduce the length of the ground paths and signal paths. If higher capacitors values are required across the signal line, one can make the signal path wider so that the IDC or PPC capacitor length does not become too long and result in a longer device. Fixed capacitors, or microelectromechanical systems (MEMS), or diode-based variable capacitors can also benefit from these ground structures.

Figure 13:
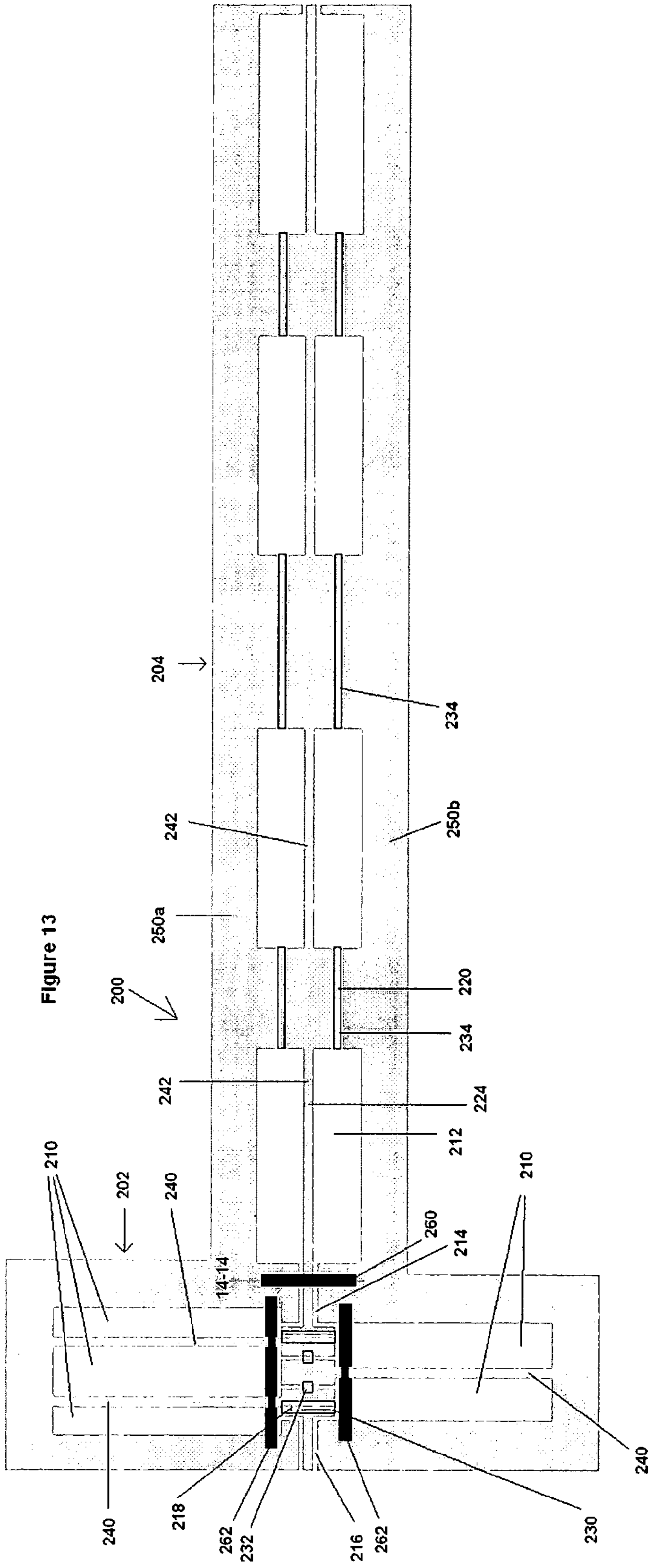
FIG. 13 is a top plan view of a high pass/low pass having ground bridges and a lumped element/CPW blend in accordance with the invention.

FIG. 13 shows a high pass/low pass filter 200, the high pass structure 202 shown as a vertical structure 202 on the left and the low pass structure shown as a horizontal structure 204 on the right. The HPF/LPF structure of FIG. 13 is formed as a printed structure by lithography/deposition/lift-off techniques as is the phase shifter of FIG. 12. By removal of metal from regions 210, 212, 214, 216, 218, and 220 to leave central RF-conducting areas indicated generally at 224, various capacitors 230, 232 and 234, and various inductors 240, 242 are defined. Electrically isolated grounding regions 250*a* and 250*b*, as initially printed by patterning of the metal, are connected by bridge structure 260. Remote regions of grounding regions 250*a* and 250*b* are further bridged by structures 262. The improvements achieved by this bridging were discussed above in reference to FIGS. 8*a* and 8*b*.

Preferably, the structures shown in FIGS. 12 and 13 are formed by deposition of multiple thin film layers, and the RF structures are formed by various lithography techniques. Such deposition, lithography and lift-off techniques are known in the art.

Figure 14:
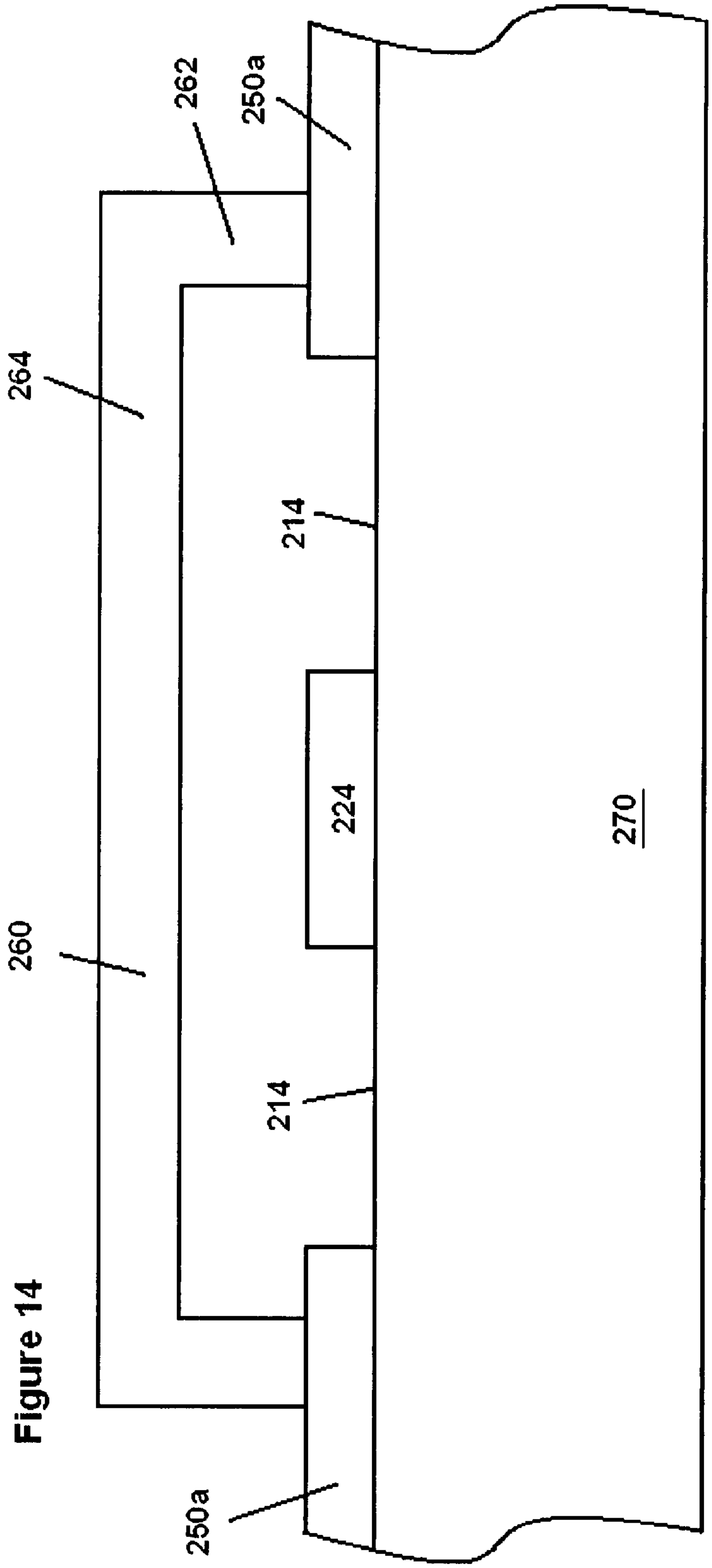
FIG. 14 is a cross-section taken along line 14-14 of FIG. 13.

After patterning of the metal layer to form the RF-conducting structures, such as capacitors and inductors, further depositions of thin film material and lithography techniques build up the various bridge structures shown in FIGS. 12 and 13. Illustrated in FIG. 14 is an enlarged cross-section taken along line 14-14 of FIG. 13. On an underlying substrate 270 are remaining portions of the original metal layer, including RF-conducting structure 224 and grounding regions 250*a* and 250*b*. Bridge structure 260 includes elevating metal sections 262 and horizontal cross section 264. The region below the horizontal cross section 264 is shown as an air gap in FIG. 14, but it may be filled with electrically-non-conducting material, such as a low loss residual photo-definable polymeric material.

One method of forming such structures is as follows. The structures are formed on a sapphire (alumina) substrate. A BST layer, typically between about 0.1 and about 0.4 microns thick is deposited by CCVD on the sapphire substrate. The BST is etched by a wet etch process to leave BST regions that serve as capacitor dielectric regions. AZO (aluminum-doped zinc oxide) is deposited and wet etched to form electrically resistive structures. AZO structures, being highly resistive, do not carry RF fields but will conduct DC current; thus, AZO structures may serve as electrodes for DC biasing. The entire structure to this point is masked, and a thin gold film is deposited by electron-beam evaporation, and patterned by lift-off. Another thick metal layer (Ti/Cu/Au) is then formed by electron beam evaporation and lift-off, providing the electrically conductive portions of the capacitors and inductors as well as the surrounding grounding material. A photosensitive polymer, that is sold under the trademark Cyclotene by Dow Company, is applied and patterned as a passivation layer, preventing the component from moisture, dusts, and other contaminations. Then, the metal that serves as the bridges is formed by electron beam evaporation, followed by lift-off.

While the above-procedure forms the bridge structures by deposition and lithography techniques, bridges could also be formed by wire bonds.

What is claimed is:

1. A radio frequency device formed from a plurality of thin films, the radio frequency structure comprising a plurality of capacitors, a plurality of inductors, and at least one signal line and at least two grounding regions, said at least two grounding regions each being located close enough to said plurality of capacitors and inductors to interact in a radio frequency spectrum, said at least two grounding regions being formed so as to electrically isolate said at least two grounding regions from each other, and the improvement wherein bridges of thin-film conductive material are patterned to electrically connect said at least two grounding regions.

2. A radio frequency device according to claim 1 wherein at least one of the bridges of electrically conductive material crosses over the at least one signal line thus connecting remote portions of at least two of said grounding regions.

3. A radio frequency device according to claim 1 wherein at least one of said capacitors is adjustable.

4. A radio frequency device according to claim 3 wherein a dielectric material of said at least one of said capacitors is tunable.

5. A radio frequency device according to claim 3 wherein a dielectric material of said at least one of said capacitors is bismuth zinc niobate or barium strontium titanate.

6. The radio frequency device according to claim 3 wherein said device functions as a phase shifter.

7. The radio frequency device according to claim 3 wherein said device functions as a filter.

8. The radio frequency device according to claim 3 wherein said device functions as a low pass filter.

9. The radio frequency device according to claim 3 wherein said device functions as a high pass filter.

10. The radio frequency device according to claim 3 wherein said device functions as a low pass/high pass filter.

11. The radio frequency device according to claim 1 wherein at least one of the bridges of electrically conductive material bridge is at least as wide as lines used to form at least one of the plurality of inductors.

12. The radio frequency device according to claim 1 wherein at least one of the bridges of electrically conductive material bridge is at least twice as wide as lines used to form at least one of the plurality of inductors.

13. The radio frequency device according to claim 1 is a coplanar waveguide.

14. A radio frequency device formed from a plurality of thin films, the radio frequency structure comprising an input, an output, a plurality of capacitors, a plurality of inductors, a signal line, and at least two grounding regions, said at least two grounding regions each being located relative to the signal line so as to form a coplanar waveguide at the input or output of the device, said at least two grounding regions each being located sufficiently close to said plurality of capacitors and plurality of inductors to interact in the radio frequency spectrum, said at least two grounding regions being formed so as to electrically isolate said at least two grounding regions from each other, and the improvement wherein at least one bridge of conductive material is formed to electrically connect said at least two grounding regions.

15. The radio frequency device according to claim 14 wherein said at least one of the bridges of electrically conductive material electrically crosses over said signal line, thus connecting remote portions of at least two of said grounding regions.

16. The radio frequency device according to claim 14 that is a tunable capacitor.

* * * * *